United States Patent
Cok

(10) Patent No.: US 7,042,444 B2
(45) Date of Patent: May 9, 2006

(54) OLED DISPLAY AND TOUCH SCREEN

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 263 days.

(21) Appl. No.: 10/346,987

(22) Filed: Jan. 17, 2003

(65) Prior Publication Data

US 2004/0140960 A1 Jul. 22, 2004

(51) Int. Cl.
*G09G 5/00* (2006.01)

(52) U.S. Cl. ............... 345/173; 178/18.01; 178/18.09; 178/18.11; 313/506; 345/156; 345/175; 345/176; 345/178

(58) Field of Classification Search ............... 345/156, 345/173, 175; 313/173, 175, 176, 178, 506; 178/18.09, 18.11
See application file for complete search history.

(56) References Cited

U.S. PATENT DOCUMENTS

| | | | | |
|---|---|---|---|---|
| 3,673,327 A | * | 6/1972 | Johnson et al. | 178/18.04 |
| 4,517,559 A | * | 5/1985 | Deitch et al. | 345/175 |
| 4,893,120 A | * | 1/1990 | Doering et al. | 341/31 |
| 4,916,308 A | * | 4/1990 | Meadows | 250/221 |
| 5,196,836 A | * | 3/1993 | Williams | 345/175 |
| 6,172,459 B1 | | 1/2001 | Hung et al. | |
| 6,498,592 B1 | * | 12/2002 | Matthies | 345/1.1 |
| 6,690,363 B1 | * | 2/2004 | Newton | 345/173 |
| 6,762,747 B1 | | 7/2004 | Fujioka et al. | |
| 6,765,351 B1 | * | 7/2004 | Forrest et al. | 313/506 |
| 6,846,579 B1 | | 1/2005 | Anderson et al. | |
| 6,864,882 B1 | * | 3/2005 | Newton | 345/173 |
| 6,879,319 B1 | | 4/2005 | Cok | |
| 2002/0033805 A1 | * | 3/2002 | Fujioka et al. | 345/175 |
| 2002/0175900 A1 | * | 11/2002 | Armstrong | 345/173 |
| 2003/0150714 A1 | | 8/2003 | Cropper et al. | |
| 2004/0090426 A1 | | 5/2004 | Bourdelais et al. | |
| 2004/0140960 A1 | | 7/2004 | Cok | |
| 2004/0140961 A1 | | 7/2004 | Cok | |
| 2004/0212603 A1 | | 10/2004 | Cok | |

* cited by examiner

*Primary Examiner*—Sumati Lefkowitz
*Assistant Examiner*—Alexander S. Beck
(74) *Attorney, Agent, or Firm*—Andrew J. Anderson; Thomas H. Close

(57) ABSTRACT

An OLED display and touch screen system including a substrate; an OLED display including an array of individually addressable OLEDs formed on the substrate; and a touch screen including an OLED light emitter formed on the substrate and a light sensor formed on the substrate across the display from the light emitter, and optics located around the display above the light emitter and the light sensor for directing light emitted from the light emitter across the display to the light sensor.

20 Claims, 4 Drawing Sheets

OLED DISPLAY AND TOUCH SCREEN

FIELD OF THE INVENTION

This invention relates generally to organic light emitting diode (OLED) displays and, more particularly, to an OLED display with a touch screen.

BACKGROUND OF THE INVENTION

Modern electronic devices provide an increasing amount of functionality with a decreasing size. By continually integrating more and more capabilities within electronic devices, costs are reduced and reliability increased. Touch screens are frequently used in combination with conventional soft displays such as cathode ray tubes (CRTs), liquid crystal displays (LCDs), plasma displays and electroluminescent displays. The touch screens are manufactured as separate devices and mechanically mated to the viewing surfaces of the displays.

US 2002/0175900 A1 by Armstrong, published Nov. 28, 2002, describes a touch system for use with an information display system including a frame defining an opening corresponding in size and shape to an information display area of a display. On each side is positioned an array of light emitting devices with a light-transmissive prism positioned along each array of light emitting devices such that light emitted from the light emitting devices is directed across the touch input area. The system also includes light detection devices positioned at each corner of the frame. In a preferred embodiment, the light emitting devices are organic light emitting diodes.

When such a touch screen is used with a flat panel display, the touch screen is simply placed over the flat panel display and the two are held together by a mechanical mounting means such as an enclosure. These prior art arrangements combining touch screens and OLED displays suffer from a variety of drawbacks. The use of frames increases the parts count, weight, and cost of the device. The separation between the touch screen and display increases thickness. Redundant components found in the display and touch screen further increase cost and decrease performance as compared to more integrated solutions. Moreover, the need for separate cabling for the touch screen increases manufacturing costs Thus, there remains a need for an improved touch screen, flat panel display system that minimizes device weight, removes redundant materials, decreases cost, eliminates special mechanical mounting designs, increases reliability, and minimizes the degradation in image quality.

SUMMARY OF THE INVENTION

The need is met according to the present invention by providing an OLED display and touch screen system including a substrate; an OLED display including an array of individually addressable OLEDs formed on the substrate; and a touch screen including an OLED light emitter formed on the substrate and a light sensor formed on the substrate across the display from the light emitter, and optics located around the display above the light emitter and the light sensor for directing light emitted from the light emitter across the display to the light sensor.

ADVANTAGES

The display according to the present invention is advantageous in that it provides a thin, light, easily manufacturable display having reduced weight, size, and cost and a greater reliability.

DETAILED DESCRIPTION OF THE INVENTION

Figure 1:
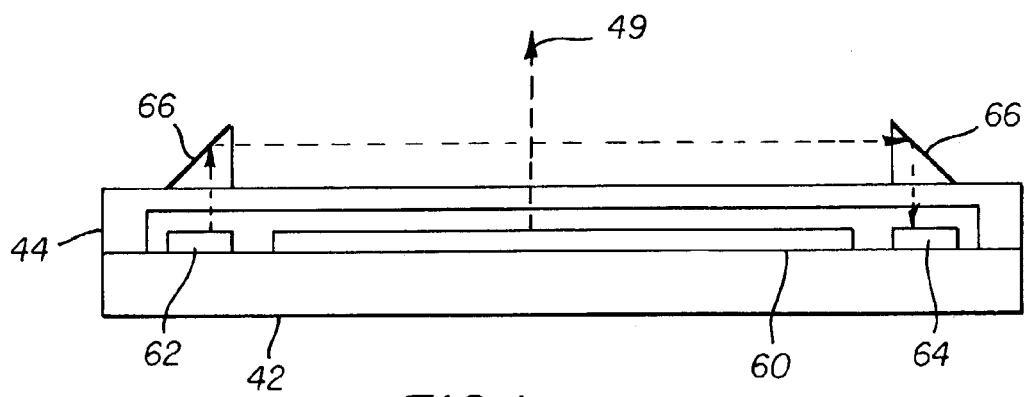
FIG. 1 is a schematic side view showing the basic structure of an integrated OLED display and touch screen according to the present invention.

Referring to FIG. 1, a top-emitting OLED display device with an integrated optical touch screen according to one embodiment of the present invention includes a rectangular substrate 42 with an encapsulating cover 44. Located on the substrate is an OLED display 60 including electrodes and multiple layers of materials such as hole-injection layers and electron transport layers as is well known in the art (not shown). Light 49 emitted from the display passes through the encapsulating cover 44 or is reflected from the substrate 42 and is emitted through the encapsulating cover 44. At one side of the rectangular substrate 42 is an array of infra red OLED light emitters 62. Infrared OLED light emitters are known and can be made, for example, by doping OLED devices with rare-earth ions such as neodymium or erbium. At the opposite side of the rectangular substrate 42 is an array of infra-red light sensors 64. Preferably, the infrared light sensors are fabricated on the substrate using organic semiconductor technology similar to that used to make the OLED display. Alternatively, the sensors can be made using thin film inorganic semiconductor technology. The sensors may include filters to improve their frequency response.

Figure 2:
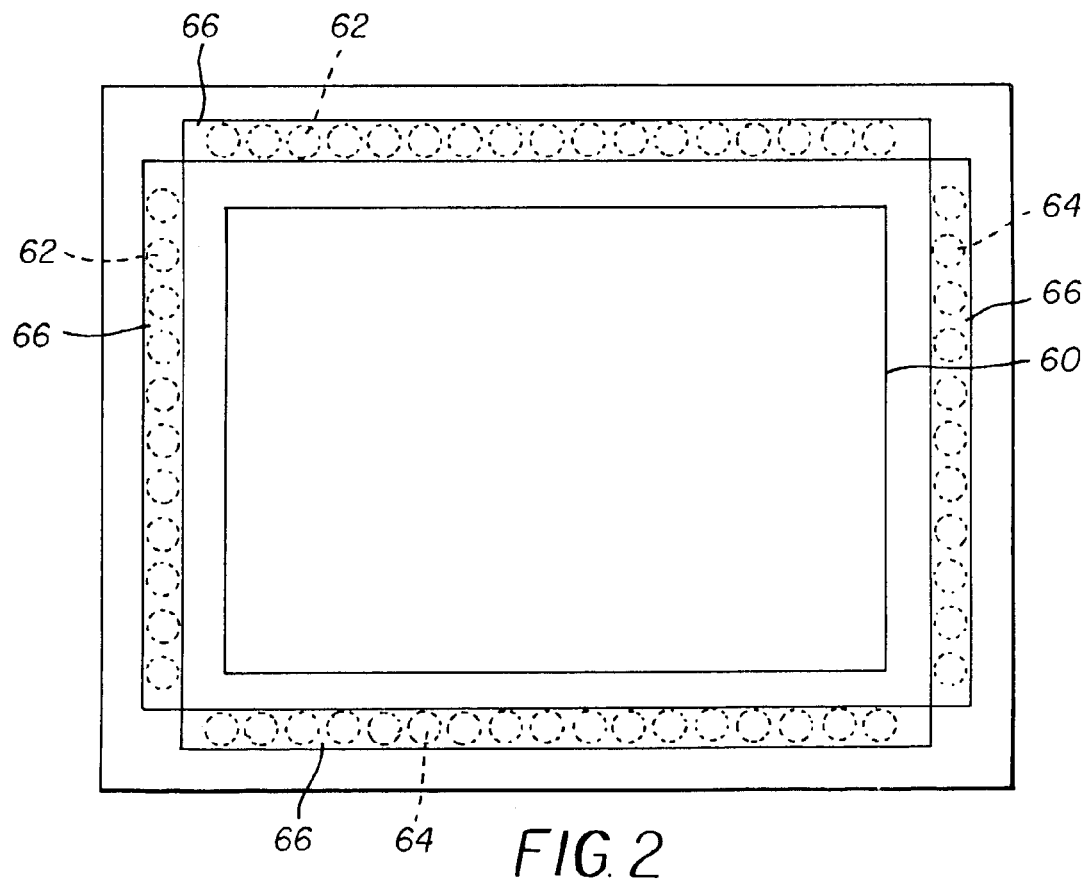
FIG. 2 is a schematic top view of the integrated OLED display and touch screen.

As shown in FIG. 2, a second pair of emitter and sensor arrays are arranged on the other two sides of the rectangular substrate 42. According to the present invention, both the light emitters 62 and sensors 64 are integrated on the same substrate as the OLED display 60. Optics, such as mirrors 66 are arranged over the encapsulating cover 44 directly above the emitter and sensor arrays for directing light emitted from the light emitters 62 across the display to the light sensors 64. The mirrors 66 can be constructed using glass or plastic prisms with a reflective side arranged at approximately 45 degrees to the cover 44. Alternatively, the mirrors can be supported at approximately 45 degree angles with respect to the cover 44. A touch screen controller (not shown) is connected to the touch screen to operate the emitters 62 and sensors 64.

Figure 3A:
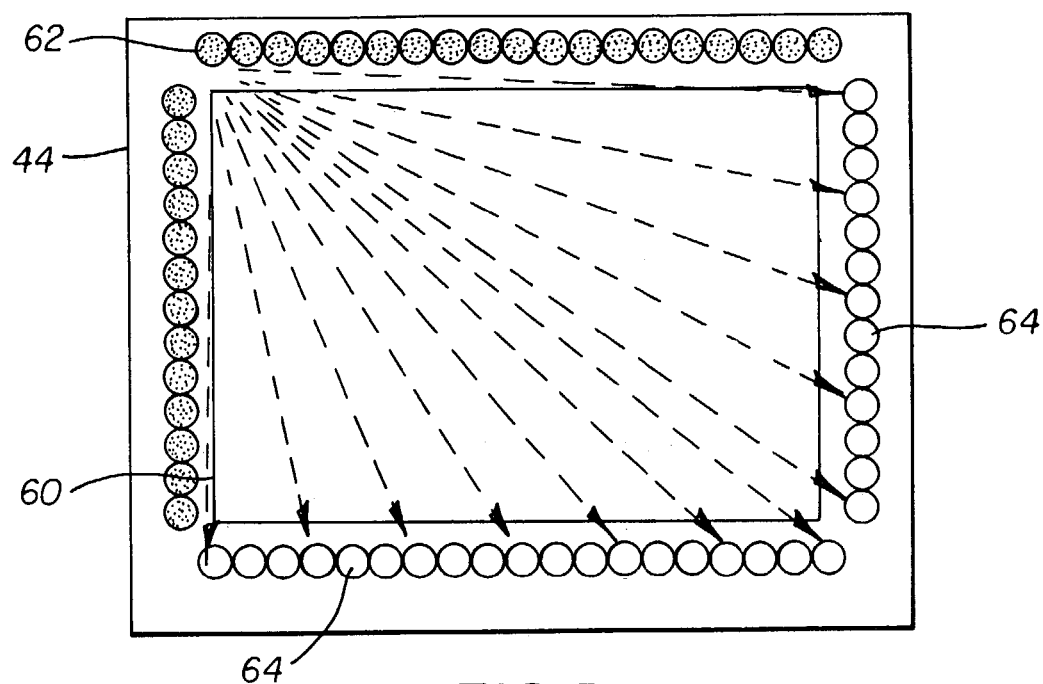
FIGS. 3a, b, and c are schematic top views of an integrated OLED display and touch screen showing alternate locations of the emitters and sensors.
Figure 3B:
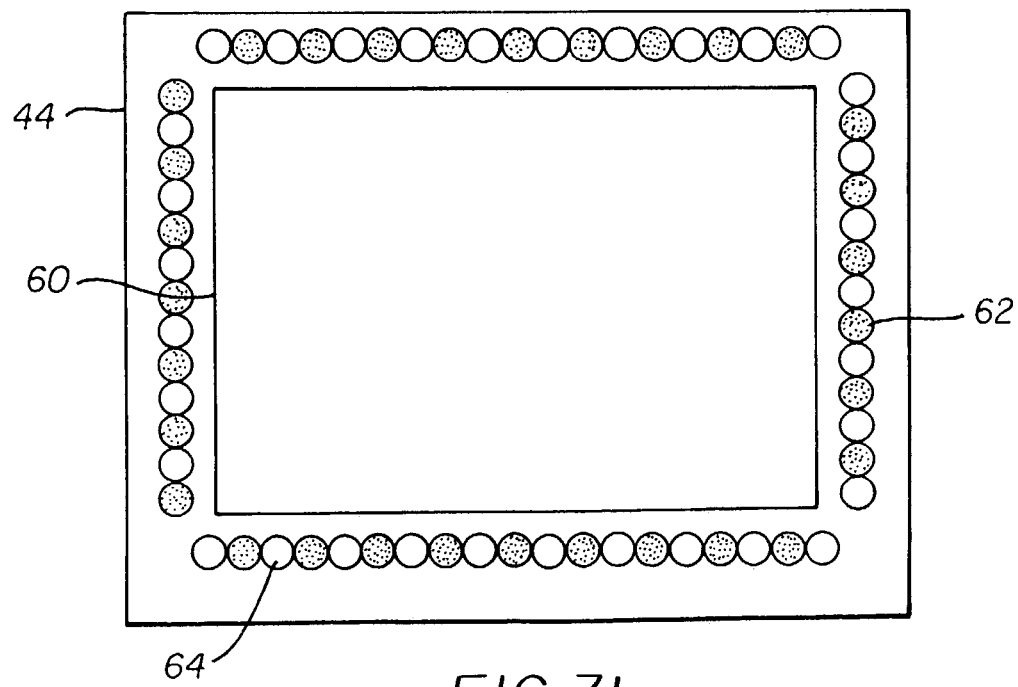
Figure 3C:
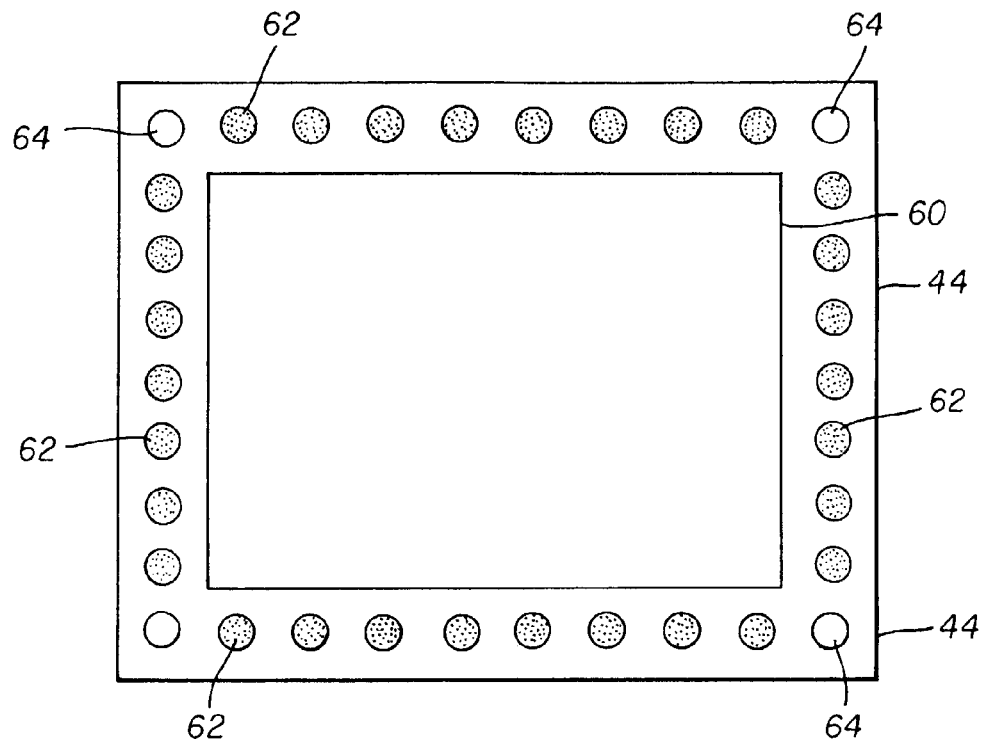

Referring to FIGS. 3a, b and c, a top view of alternative arrangements of the light emitters 62 and sensors 64 are shown. In the arrangement shown in FIG. 3a, the light emitters 62 are located in two arrays adjacent two contiguous edges of the display 60 and the sensors 64 are located in two arrays adjacent the other two edges of the display 60. In the arrangement shown in FIG. 3b, the light emitters 62 and sensors 64 are interdigitated in arrays surrounding the display 60. In the arrangement shown in FIG. 3c, emitter arrays are located on all four sides of the display area 60 and sensors 64 are located at the corners of the display 60, similar to the arrangement shown by Armstrong in published US Patent Application 2002/0175900.

In operation, the infra-red OLED light emitters 62 emit light in every direction. The light is reflected from the 45 degree mirrors 66 located above the emitters and pass over the surface of the OLED display 60. After passing over the surface of the OLED display, the light is reflected by the 45 degree mirrors located above the sensors 64 to the infra-red sensors 64. The sensors 64 detect the light and produce feedback signals that are supplied to the touch screen controller and interpreted in a conventional manner to locate the position of an object that interrupts the light from the emitters 62. Because the touch screen elements are integrated on a common substrate with the display, a single connector may be used for both the touch screen and the display. Elements of the touch screen controller and/or the display controller may be integrated on the substrate.

Because each infrared OLED light emitter 62 emits light in every direction, a single emitter can be used in conjunction with multiple sensors 64 to detect a touch. Alternatively, multiple emitters can be used in conjunction with a single sensor to detect a touch. The emitters and sensors can be energized sequentially or in common to optimize the performance of the touch screen under a wide variety of conditions, including high ambient light, low-power operation, a noisy environment, or high performance mode.

The emitters may be energized sequentially to provide multiple signals thereby increasing the signal-to-noise ratio of the result and providing a more detailed map of any touching implement that inhibits the transmission of the infrared light. In yet another mode, the emitters are energized simultaneously and the relative amount of light sensed by the sensors 64 are used to detect a touch. In this arrangement, the emitters 62 can be a single long emitter with a single control signal.

The use of multiple emitters and sensors enables a very robust sensing apparatus. Single-point failures can be overcome and convex shapes can be detected. High-reliability operation is possible by combining signals from various emitters sensed by various sensors. The infrared signal itself may be modulated to overcome background noise or different frequencies of infrared light may be emitted and detected.

Figure 4:
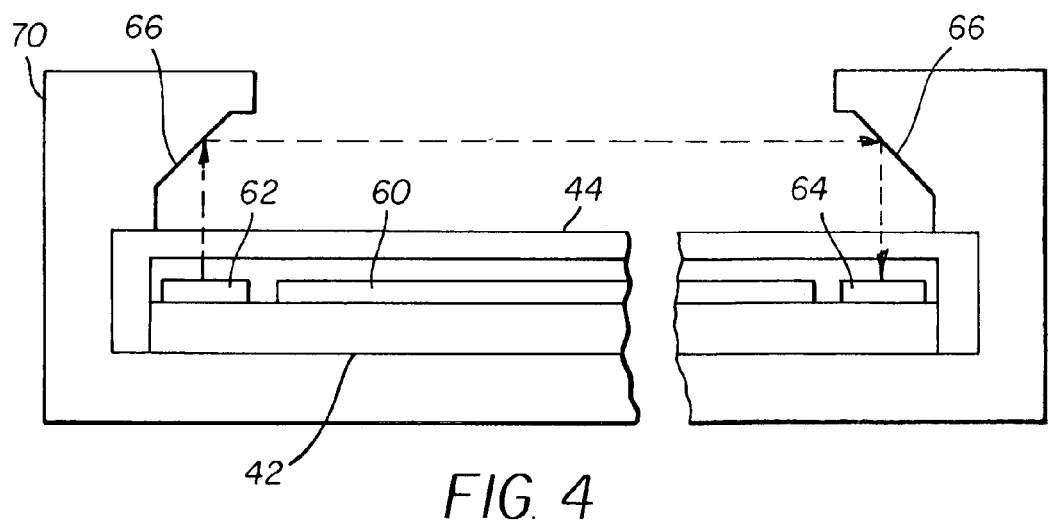
FIG. 4 is a schematic side view of an integrated OLED display and touch screen wherein the optics located around the frame are mirrored surfaces of the frame according to one embodiment of the invention.
Figure 5:
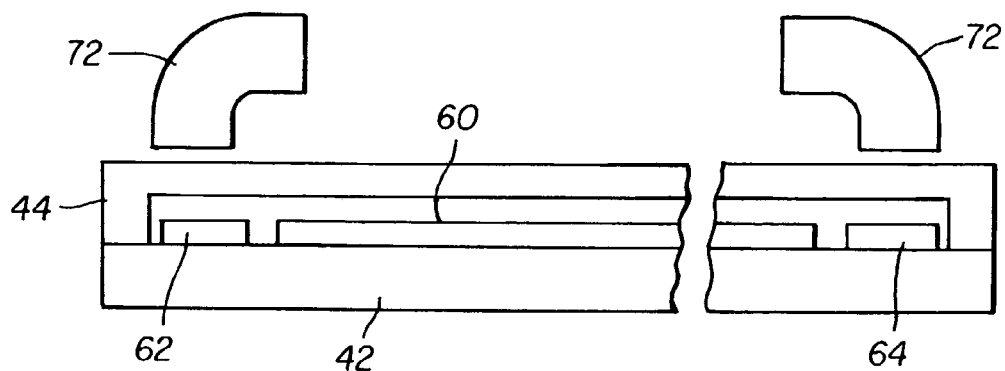
FIG. 5 is a schematic side view of an integrated OLED display and touch screen wherein the optics located around the frame are light pipes.

Referring to FIG. 4, the 45 degree mirrors 66 located above the emitters 62 and sensors 64 may be formed by a reflective surface on an enclosure 70 enclosing the integrated display and touchscreen. Referring to FIG. 5, the optics for directing light emitted from the light emitter 62 across the display to the light sensor 64 may comprise light pipes 72. In a specific embodiment, the optics may be fiber optics.

Figure 6:
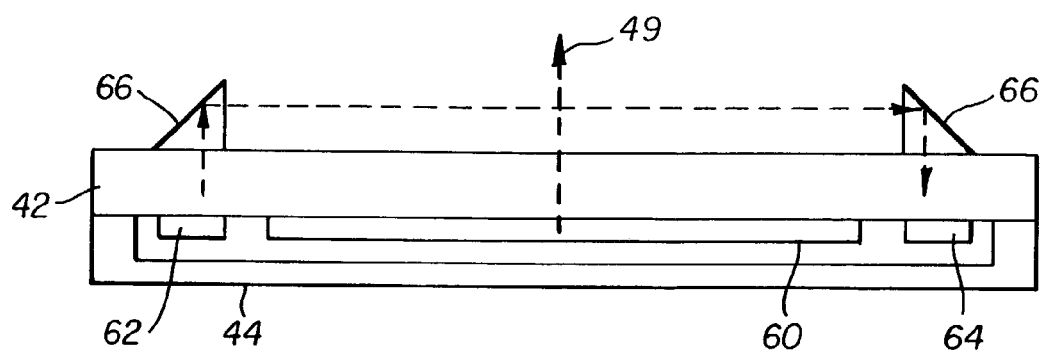
FIG. 6 is a schematic side view of an integrated OLED display and touch screen wherein the OLED display is a bottom emitting display.

Referring to FIG. 6, a bottom-emitting OLED display device with an integrated optical touch screen according to another embodiment of the present invention includes a rectangular substrate 42 with an encapsulating cover 44. Located on the substrate is an OLED display 60 including electrodes and multiple layers of materials such as hole-injection layers and electron transport layers as is well known in the art (not shown). Light 49 emitted from the display passes directly through the substrate 42 or is reflected from the encapsulating cover 44 and passes through the substrate 42.

Because the present invention does not require a separate frame or substrate for the touch screen, it reduces the weight, size (thickness), and cost of a combined touch screen and OLED display device.

The invention has been described in detail with particular reference to certain preferred embodiments thereof, but it will be understood that variations and modifications can be effected within the spirit and scope of the invention.

PARTS LIST 42 substrate
44 encapsulating cover
49 emitted light
60 OLED display
62 light emitter
64 light sensor
66 mirror
70 enclosure
72 light pipe

What is claimed is:

1. An OLED display and touch screen system, comprising:
  a) a substrate;
  b) an OLED display including an array of individually addressable OLEDs formed on the substrate; and
  c) a touch screen including an OLED light emitter formed on the substrate and a light sensor formed on the substrate across the display from the light emitter, and optics located around the display above the light emitter and the light sensor for directing light emitted from the light emitter across the display to the light sensor, wherein the OLED light emitter and the light sensor of the touch screen are integrated on the substrate with the individually addressable OLEDs of the OLED display.

2. The OLED display and touch screen claimed in claim 1, wherein the OLED light emitter is a linear array of individually addressable OLEDs and the light sensor is a linear array of light detecting elements.

3. The OLED display and touch screen claimed in claim 2, wherein the OLEDs of the OLED light emitter and the light detecting elements are interspersed in a plurality of linear arrays.

4. The OLED display and touch screen claimed in claim 2, further comprising control electronics for sequentially activating the OLEDs of the OLED light emitter.

5. The OLED display and touch screen claimed in claim 2, further comprising control electronics for simultaneously activating the OLEDs of the OLED light emitter.

6. The OLED display and touch screen claimed in claim 1, further comprising control electronics for activating the OLED light emitter in a predetermined temporal pattern and for filtering an output from the light sensor to detect the predetermined pattern.

7. The OLED display and touch screen claimed in claim 1, further comprising unitary control electronics for controlling both the OLED display and the touch screen.

8. The OLED display and touch screen claimed in claim 1, wherein the light sensor is a non-organic light detecting element.

9. The OLED display and touch screen claimed in claim 8, wherein the non-organic light detecting element is a silicon light detecting element.

10. The OLED display and touch screen claimed in claim 1, wherein the OLED light emitter is a linear OLED and the light sensor is a linear array of light detecting elements.

11. The OLED display and touch screen claimed in claim 1, wherein the OLED display is a top emitting display.

12. The OLED display and touch screen claimed in claim 1, wherein the OLED display is a bottom emitting display.

13. The OLED display and touch screen claimed in claim 1, wherein the OLED light emitter emits infrared light.

14. The OLED display and touch screen claimed in claim 1, wherein the optics are 45 degree mirrors.

15. The OLED display and touch screen claimed in claim 14, further comprising a frame surrounding the OLED display, and wherein the 45 degree mirrors are supported by the frame.

16. The OLED display and touch screen claimed in claim 14, further comprising a frame surrounding the OLED display, and wherein the 45 degree mirrors are formed on the frame.

17. The OLED display and touch screen claimed in claim 16, including an enclosure for the display wherein the frame is a portion of the enclosure.

18. The OLED display and touch screen claimed in claim 1, wherein the optics comprise light pipes.

19. An OLED display and touch screen system, comprising:
   a) a substrate;
   b) an OLED display including an array of individually addressable OLEDs formed on the substrate; and
   c) a touch screen including an OLED light emitter formed on the substrate and a light sensor formed on the substrate across the display from the light emitter, and optics located around the display above the light emitter and the light sensor for directing light emitted from the light emitter across the display to the light sensor;
   further comprising unitary control electronics for controlling both the OLED display and the touch screen, wherein the control electronics are formed on the substrate.

20. An OLED display and touch screen system, comprising:
   a) a substrate;
   b) an OLED display including an array of individually addressable OLEDs formed on the substrate; and
   c) a touch screen including an OLED light emitter formed on the substrate and a light sensor formed on the substrate across the display from the light emitter, and optics located around the display above the light emitter and the light sensor for directing light emitted from the light emitter across the display to the light sensor, wherein the light sensor is an organic light sensor.

* * * * *